US007002344B2

(12) United States Patent
Griswold et al.

(10) Patent No.: US 7,002,344 B2
(45) Date of Patent: Feb. 21, 2006

(54) DATA ACQUISITION METHOD FOR ACCELERATED MAGNETIC RESONANCE IMAGING IN FRAMEWORK OF THE PARALLEL ACQUISITION OF MRT DATA

(76) Inventors: Mark A. Griswold, Hindenburgring Nord 11, 97318 Kitzingen (DE); Peter Jakob, Unterer Neubergweg 6B, 97074 Würzburg (DE)

( * ) Notice: Subject to any disclaimer, the term of this patent is extended or adjusted under 35 U.S.C. 154(b) by 27 days.

(21) Appl. No.: 10/831,890

(22) Filed: Apr. 26, 2004

(65) Prior Publication Data

US 2004/0222794 A1    Nov. 11, 2004

(51) Int. Cl.
    *G01V 3/00*    (2006.01)

(52) U.S. Cl. ..................................... 324/309; 324/307

(58) Field of Classification Search ............... 324/309, 324/307, 306; 600/422, 410
See application file for complete search history.

(56) References Cited

U.S. PATENT DOCUMENTS

| 6,486,671 | B1 * | 11/2002 | King .......................... 324/307 |
| 6,841,998 | B1 * | 1/2005 | Griswold .................... 324/309 |
| 6,900,631 | B1 * | 5/2005 | Bydder et al. .............. 324/307 |
| 6,903,551 | B1 * | 6/2005 | Madore ...................... 324/309 |
| 6,915,152 | B1 * | 7/2005 | Zhu ............................ 600/422 |

OTHER PUBLICATIONS

SENSE: Sensitivity Encoding for Fast MRI; Klaas P. Pruessmann, MarkusWeiger, Markus B. Scheidegger, and Peter Boesiger; Magnetic Resonance in Medicine 42:952-962 (1999).

Contrast-Enhanced 3D MRA Using SENSE; Markus Weiger, PhD, Klaas P. Pruessmann, PhD, Andrea Kassner, MSc,, Giles Roditi, FRCP, FRCR, Tristan Lawton, Allan Reid, FRCR, and Peter Boesiger, PhD; Journal of Magnetic Resonance Imaging 12:671-677 (2000).
Partially Parallel Imaging With Localized Sensitivities (PILS); Mark A. Griswold, I, Peter M. Jakob, Mathias Nittka, James W. Goldfarb, and Axel Haase; Magnetic Resonance in Medicine 44:602-609 (2000).
Adaptive Reconstruction of Phased Array MR Imagery; David O. Walsh, Arthur F. Gmitro, and Michael W. Marcellin; Magnetic Resonance in Medicine 43:682-690 (2000).
An Investigation into the Use of Sensitivity-Encoded Techniques to Increase Temporal Resolution in Dynamic Contrast-Enhanced Breast Imaging; David J. Larkman, PhD, Nandita M. deSouza, MD, Mark Bydder, PhD, and Joseph V. Hajnal PhD; Journal of Magnetic Resonance Imaging 14: 329-335 (2001).

(Continued)

Primary Examiner—Louis Arana
(74) Attorney, Agent, or Firm—Schiff Hardin LLP

(57) ABSTRACT

A method and appertaining device is provided for magnetic resonance imaging of a contiguous region of a subject under application of the partially parallel acquisition via modulation of the spin magnetization by way of radio-frequency pulses, as well as via spatial coding of the subject region and via subsequent measurement in cycles of the radio-frequency response signals showing the excited spins. Based on the measurement of the radio-frequency response signals by a coil array comprising two or more radio-frequency receiver coils via which both the coil sensitivity information and the radio-frequency response signals are acquired, each radio-frequency receiver coil acquires a reduce data set for implementation of the image reconstruction and additional modulations of the spin magnetization are used; additional modulations are comprised of modulations of radio-frequency pulses and/or additional modulation of gradients used for spatial coding of the subject regions.

21 Claims, 15 Drawing Sheets

OTHER PUBLICATIONS

Use of Multicoil Arrays for Separation of Signal from Multiple Slices Simultaneously Excited; David L. Larkman, PhD,I Joseph V. Hajnal, PhD, Amy H. Herlihy, PhD, Glyn A. Coutts, PhD,I Ian R. Young, PhD, and Gösta Ehnholm, PhD; Journal of Magnetic Resonance Imaging 13:313-317 (2001).

VD-AUTO-SMASH Imaging: Robin M. Heidermann, Mark A. Griswold, Axel Haase, and Peter M. Jakob; Magnetic Resonance in Medicine 45:1066-1074 (2001); 1066-1074.

Advances in Sensitivity Encoding With Arbitrary k-Space Trajectories; Klaas P. Pruessmann, Markus Weiger, Peter Börnert, and Peter Boesiger; Magnetic Resonance in Medicine 46; 638-651, (2001).

Recent advances in image reconstruction, coil sensitivity calibration, and coil array design for SMASH and generalized parallel MRI; Daniel K. Sodickson, Charles A. McKenzie, Michael A. Ohliger , Magnetic Resonance Materials in Physics, Biology and Medicine 13; 158-163, (2002).

2D SENSE for faster 3D MRI; Markus Weiger, Klaas P. Pruessmann, Peter Boesiger; Magnetic Resonance Materials in Physics, Biology and Medicine 14; 10-19, (2002).

Generalized SMASH Imaging; Mark Bydder, David J. Larkman, and Joseph V. Hajnal; Magnetic Resonance in Medicine 47: 160-170 (2002).

Generalized Autocalibrating Partially Parallel Acquisitions (GRAPPA); Mark A. Griswold, Peter M. Jakob, Robin M. Heidemann, Mathias Nittka, Vladimir Jellus, Jianmin Wang, Berthold Kiefer, and Axel Haasel; Magnetic Resonance in Medicine 47: 1202-1210 (2002).

Interleaved Pulsed MAMBA: A New Parallel Slice Imaging Method; Martyn N.J. Paley, Kuan J. Lee, James M. Wild, Elspeth H. Whitby, and Paul D. Griffiths; Magnetic Resonance in Medicine 48: 1043-1050 (2002).

Self-Calibrating Parallel Imaging With Automatic Coil Sensitivity Extraction; Charles A. McKenzie, Ernest N. Yeh, Michael A. Ohliger, Mark D. Price, and Daniel K. Sodickson; Magnetic Resonance in Medicine 47: 529-538 (2002); DOI 10.1002/mrm. 10087.

Implications of SENSE MR in routine clinical practice; Johan S. van den Brink, Yuji Watanabe, Christiane K. Kuhl, Taylor Chung, Raja Muthupillai, Marc Van Cauten, Kei Yamada, Steven Dymarkowski, Jan Bogaert, Jeff H. Maki, Celso Matos, Jan W. Casselman, Romhild M. Hoogeveen; European Journal of Radiology 46 (2003) 3-27.

* cited by examiner

INVENTION: R = 2

Conventional: R = 2

Coding direction 2

Coding direction 1

R = 1

Coil 1   Coil 2
Coil 3   Coil 4

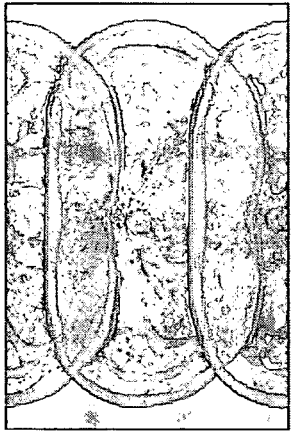
FIG. 9A conv: R=2
Slice 1 + Slice 2
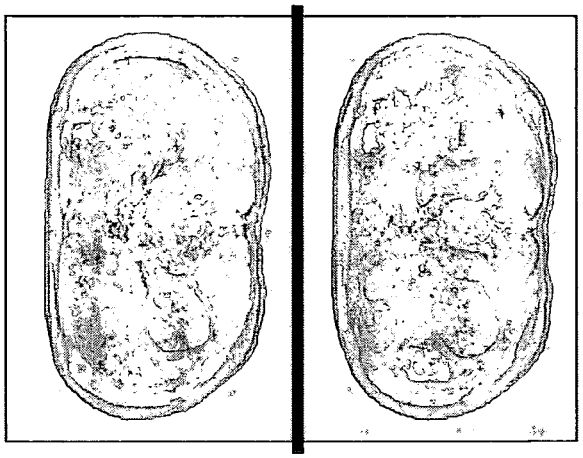
FIG. 9C INVENTION: R=2
Slice 1, Slice 2, Slice 1
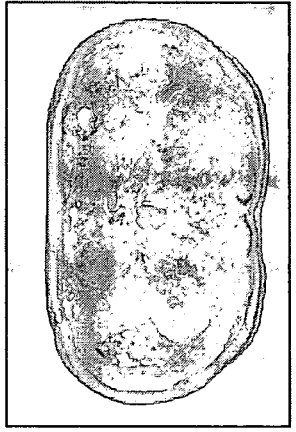
FIG. 9B Conventional
Slice 1 | Slice 2
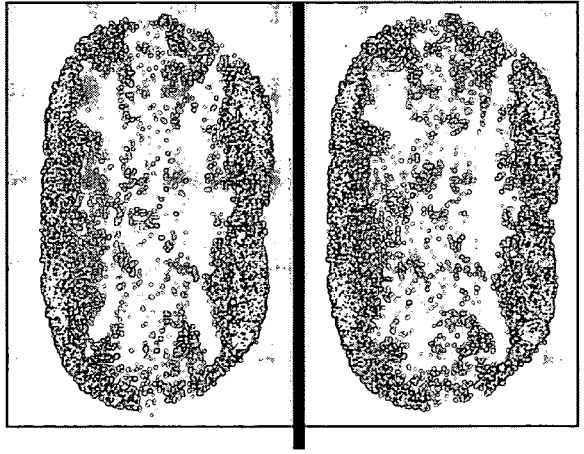
FIG. 9D INVENTION
Slice 1 | Slice 2

DATA ACQUISITION METHOD FOR ACCELERATED MAGNETIC RESONANCE IMAGING IN FRAMEWORK OF THE PARALLEL ACQUISITION OF MRT DATA

BACKGROUND OF THE INVENTION

The present invention concerns a method for magnetic resonance imaging of a contiguous region of a subject, applying a partial parallel acquisition (PPA) via modulation of spin magnetization by way of radio-frequency pulses, as well as via spatial coding of the subject region and via subsequent measurement in cycles of the radio-frequency response signals showing the excited spins, based on the measurement of the radio-frequency response signals by a coil array comprising two or more radio-frequency receiver coils (via which both the coil sensitivity information and the radio-frequency response signals are acquired), whereby each radio-frequency receiver coil acquires a reduced data set for implementation of the image reconstruction.

The inventive method is also called by the acronym CAIPIRINHA (Controlled Folding In Parallel Imaging Results In Higher Acceleration) for reasons described below.

Magnetic resonance tomography (MRT) is based on the physical phenomenon of nuclear magnetic resonance and is used as an imaging method in medical diagnostics and in biophysics. As a "non-invasive" examination method with versatile contrast capabilities for slice-by-slice imaging of body organs, MRT has developed into a method that is in many aspects superior to x-ray computer tomography (CT). It is also important that in MRT, in comparison to CT, the patient undergoes no damaging radiation exposure.

In spite of the technical advances in the sequence methodology and in the hardware development, the acquisition time required for an MRT image remains a limiting factor. The development of methods to shorten the image measurement times is a goal because boundaries are placed on a further increase of the technical capacity (magnetic field strengths and pulse strengths) of MRT devices solely for reasons of patient protection (stimulation and tissue heating). A faster MRT imaging and "real-time imaging" to support minimally-invasive surgery have many advantages. With these technologies, expensive and high-risk examinations (such as heart catheter examinations) can be avoided.

The following explanation provides background for central terms and describes the experimental principle of MRT as well as the events necessary for image creation. In MRT, the examination subject is exposed to a strong, constant external magnetic field. In the body to be examined, the nuclear spins of the atoms that were previously oriented in various directions align according to the external magnetic field (spin magnetization). Radio-frequency waves of suitable frequencies, generated by additional coils, can excite the aligned nuclear spins to a specific oscillation. The signal to be measured is generated via this oscillation, which is registered with the aid of one or more receiver coils (see, e.g., Roemer P B, Edelstein W A, Hayes C E, Souza S P, Mueller O M. The NMR phased array. Magn. Reson Medical 1990; 16: 192–225).

With the aid of gradient coils, inhomogeneous magnetic fields (gradient fields) can be generated that coordinate in "pulse sequences" that enable a free selection of a slice to be imaged of the human body or, respectively, of an organ (spatial coding) to be imaged. For spatial coding, gradients are used that show in all three spatial directions. One differentiates the slice selection by the gradients $G_z$ and the frequency coding (also designated as read coding) and the phase coding by respectively one of the two gradients $G_x$ or $G_y$. The gradient $G_z$ typically establishes an acquisition layer in the direction of the z-axis. The coding direction of the gradients $G_x$ and $G_y$ (which are orthogonal to one another) lie within the slice selected by $G_z$ and allow (together with $G_z$) a complete spatial coding of the body region to be examined. For this, the measurement signals of the same y-coordinates are provided with the aid of a phase coding gradient with the same phase shift (phase displacement).

Upon readout, a third gradient is switched that ensures all regions with the same x-coordinates have the same frequency upon the data acquisition. The third gradient, here $G_x$, is also designated as a read gradient or frequency coding gradient.

In MRT, the measurement data is acquired in "k-space", which is spanned by the spatial coding. The data of an individual k-space line are, as already noted, frequency-coded by way of a gradient upon readout. The separation of the lines in k-space $\Delta k_y$ is normally generated via phase coding. K-space is associated with the image space via the mathematical operation of the Fourier transformation. The Fourier transformation of a function yields a decomposition of the function into periodic components of the wave number k. K-space is also called Fourier space or spatial frequency space.

The mathematical operation of folding additionally plays an important role in the framework of MRT image reconstruction. Folding or in-foldings are artifacts that, for example, always occur when the selected image region (FOV) is smaller than the extent/measure of the subject; or if, for example, a plurality of slices are simultaneously excited, one slice folds on the other and they can no longer be clearly separated. Altogether, "folding effects" are created due to such superimposition of various subject regions that should appear separated for imaging. These are also designated as "folding artifacts", or folding, and occur in particular in the acquisition of reduced data sets under application of the partial parallel imaging.

This method (which simultaneously uses a plurality of coils for data acquisition) may be called partially parallel acquisition (PPA) and is explained more precisely later as the basis of the most frequent MRT methods. Given the selection of the phase coding direction via a gradient, for example $G_y$, folding also taken into account in the MRT experiment, meaning the folding is recognizable as such in the planning of the experiment. In connection with the inventive method, it has been recognized that an additional, monitored modulation of the magnetization allows the control of the folding.

In the past, the shortening of the measurement times was enabled via a number of improvements. These include the introduction of faster spin echo sequences and gradient echo sequences, or the development of the FLASH pulse sequence (Haase et al., 1986), which enabled a clear reduction of the time interval (TR) between the nuclear magnetic resonance excitations repeated during the MRT measurement. Naturally, the shortening of the measurement times was also enabled via the constant technical development of the hardware of MRT devices. The PPA imaging used in connection with the inventive method also belongs to this area.

The PPA imaging is characterized in that, via linear algebra, a plurality of incomplete MRT data sets of a subject that are, however, acquired simultaneously can be reconstructed into a complete image via the mathematical process of unfolding (see Bydder M, Larkman D J, Hajnal J V Generalized SMASH imaging. Magn Reson Med. 2002

January;47(1):160–70, Carlson J W, Minemura T. Imaging time reduction through multiple receiver coil data acquisition and image reconstruction. Magn Reson Med 1993; 29: 681–688, Carlson J W. An algorithm for NMR imaging reconstruction based on multiple RF receiver coils. J Magn Reson 1987; 74: 376–380, Griswold M A, Jakob P M, Heidemann R M, Nittka M, Jellus V, Wang J, Kiefer B, Haase A. Generalized autocalibrating partially parallel acquisitions (GRAPPA). Magn Reson Med 2002; 47: 1202–1210, Griswold M A, Jakob P M, Nittka M, Goldfarb J W, Haase A. Partiallay parallel imaging with localized sensitivities (PILS). Magn Reson Med 2000; 44: 602–609, Heidemann R M, Griswold M A, Haase A, Jakob P M. VD-AUTO-SMASH imaging. Magn Reson Med 2001; 45:.1066–1074, Hutchinson M, Raff U. Fast MRI data acquisition using multiple detectors. Magn Reson Med 1988; 6: 87–91., Jakob P M, Griswold M A, Edelman R R, Sodickson D K. AUTO-SMASH, a Self-Calibrating technique for SMASH imaging. MAGMA 1998; 7: 42–54, Kellman P, Epstein F H, McVeigh E R. Adaptive sensitivity encoding incorporating temporal filtering (TSENSE). Magn Reson Med. 2001 May; 45(5):846–52., Kellman P, McVeigh E R. Ghost artifact cancellation using phased array processing. Magn Reson Med. 2001 August;46(2):335–43., Kelton J R, Magin R L, Wright S M. An algorithm for rapid image acquisition using multiple receiver coils. In: Proceedings of the 8th Annual Meeting of SMRM 1989: 1172., Kwiat D, Einav S, Navon G. A decoupled coil detector array for fast image acquisition in magnetic resonance imaging. Med Phys 1991; 18: 251–265., Kwiat D, Einav S. Preliminary experimental evaluation of an inverse source imaging procedure using a decoupled coil detector array in magnetic resonance imaging. Med Eng Phys 1995; 17: 257–263., Kyriakos W E, Panych L P, Kacher D F, Westin C F, Bao S M, Mulkern R V, Jolesz F A. Sensitivity profiles from an array of coils for encoding and reconstruction in parallel (SPACE RIP). Magn Reson Med. 2000 August;44(2):301–8., Larkman D J, Hajnal J V, Herlihy A H, Coutts G A, Young I R, Ehnholm G. Use of multicoil arrays for separation of signal from multiple slices simultaneously excited. J Magn Reson Imaging. 2001 February;13(2):313–7. McKenzie C A, Yeh E N, Ohliger M A, Price M D, Sodickson D K. Self-calibrating parallel imaging with automatic coil sensitivity extraction. Magn Reson Med. 2002 March;47(3):529–38., Pruessmann K P, Weiger M, Bornert P, Boesiger P. Advances in sensitivity encoding with arbitrary k-space trajectories. Magn Reson Med. 2001 October;46(4):638–51., Pruessmann K P, Weiger M, Scheidegger M B, Boesiger P. SENSE: sensitivity encoding for fast MRI. Magn Reson Med. 1999 November;42(5):952–62. , Ra J B, Rim C Y. Fast imaging using subencoding data sets from multiple detectors. Magn Reson Med 1993; 30: 142–145., Sodickson D K, Manning W J. Simultaneous acquisition of spatial harmonics (SMASH): Fast imaging with radiofrequency coil arrays. Magn Reson Med 1997; 38: 591–603, Sodickson D K, McKenzie C A. A generalized approach to parallel magnetic resonance imaging. Med Phys. 2001 August;28(8):1629–43., Wang J, Kluge T, Nittka M, Jellus V, Kuehn B, Kiefer B. Parallel Acquisition Techniques with Modified SENSE Reconstruction mSENSE. In: Proceedings of the First Wurzburg Workshop on Parallel Imaging. Pg. 92 (2001), Weiger M, Pruessmann K P, Boesiger P. 2D SENSE for faster 3D MRI. MAGMA. 2002 March;14(1):10–9). The coil geometry established by the assembly of the component coil comprising a plurality of individual coils thereby determines the folding effects occurring during the data acquisition.

The spatial separation of the measurement region and the simultaneous time-saving acquisition of partial images in PPA-MRT is experimentally enabled in that a plurality of individual coils that form a "coil array" are arranged around the subject to be examined. Each of the spatially independent coils of the array registers certain spatial information that is acquired as coil sensitivity information. This information is used in order to achieve a complete spatial coding via the combination of the data simultaneously acquired by a plurality of individual coils. A PPA acquisition typically results in folded images, whereby a folded image data set exists for each individual coil. The selection of the phase coding direction establishes the direction in which the folding effects occur in the subject space, and therewith in the image space. Special reconstructions that effectively correspond to an unfolding of the folded data set are then applied to the reduced data in order to reconstruct the missing image information.

In a PPA acquisition, conventional standard sequences (gradient echo, spin echo, EPI, True FISP, etc.) are utilized using radio-frequency pulses and magnetic field gradients; however, in comparison to the conventional acquisition, only a fraction ($\frac{1}{2}$, $\frac{1}{3}$, $\frac{1}{4}$, etc.) of the phase coding lines are acquired. The complete image is thus obtained in a fraction of the time. The shortening of the image measurement time achieved via the PPA corresponds to the ratio of the number of lines of the complete data set to the number of lines of the reduced data set and is characterized by a reduction factor R.

However, given PPA imaging for a specific location in the examination subject, a complete reconstruction is only possible when clear sensitivity differences between the individual coils exist at this location. A robust reconstruction thus assumes an optimally large number of individual coils in two or three spatial directions, whereby the number of coils is also always limited by the state of technology. This problem restricts the PPA imaging in a disadvantageous manner with regard to the signal-to-noise ratio.

The further problems of the PPA imaging results from the fact that the PPA methods are exclusively oriented to the reconstruction of the data after completion of the acquisition. Given the SENSE (sensitivity encoding for fast MRI) method belonging to the prior art, the matrix inversion is exclusively applied after the data acquisition, in the framework of the postprocessing. Monitoring mechanisms that modify and control the folding space and folding effects during the actual data acquisition are unknown as of yet.

SUMMARY OF THE INVENTION

Based on the prior art, the object of providing MRT imaging based on the PPA technique therefore comprises the development of a method to monitor the folding conditions during the data acquisition, such that the quality of the subsequent digital image reconstruction is, to the greatest possible extent, independent of the geometry of the individual coils used, and at the same time the advantage of the fast imaging can still be used.

To achieve this objective, method steps were developed that allow a modification of the folding effects that are created along a specific spatial dimension without the additional modulations of the spin magnetization and which, after the additional modulations of the spin magnetization, shift into at least one of the other spatial dimensions in which reduced data sets of the partial parallel acquisition ensue. In addition to the steps belonging to the PPA imaging, the method comprises the following steps:

use of additional modulations of the spin magnetization, whereby the additional modulations are comprised of modulations of radio-frequency pulses and/or additional modulation of gradients used for spatial coding of the subject regions, and modification of the coil sensitivity information according to the respective preceding additional modulations of the spin magnetization.

The embodiments of the invention described below consider that, given application of the partial parallel acquisition during all steps necessary for acquisition of an MRT image, an additional modulation of the spin magnetization is implemented, and this is used in connection with the modification of the coil sensitivity information according to the respective preceding additional modulations of the spin magnetization in the image reconstruction. The noted coil sensitivity information is necessary for image reconstruction via Fourier transformation, in addition to the image data acquired in k-space. Given application of additional modulation of the spin magnetization, coil sensitivity information modified according to the respective preceding additional modulations of the spin magnetization must compulsorily be taken into account for the image reconstruction.

Via the additional modulation, the folding matrix and the associated folding space are modified such that any folding effects that are created along a specific spatial dimension without additional modulation of the spin magnetization additionally change in at least one other spatial dimension in which reduced data sets acquired with the aid of the PPA method occur. Via the additional monitored modulation of the magnetization, an influence of the folding conditions that can be monitored is effectively achieved, in that the folding artifacts occurring given parallel acquisition are, as already noted, additionally created in a different spatial dimension than that of the normal data acquisition, and the folded image information can thereby be more easily unfolded.

The embodiments of the invention provide a high image quality given parallel imaging experiments made possible via the monitoring and the registration of the changed folding effects in the form of modified coil sensitivity information. The high image quality is established in that the part of the image information that would not be unfoldable without application of additional modulations of the spin magnetization during the experiment is now accessible for the image reconstruction. Given equal measurement time, this means that more image information is available for the subsequent image reconstruction via the inventive method steps. The advantages of the method also remain given higher reduction factors. Additionally, disadvantageous folding situations that can lead to poorer image reconstructions are prevented. Overall, given a higher signal-to-noise ratio (S/R), a better image quality and a shortening of the imaging time is thus achieved. Moreover, it could be shown that the inventive method allows the image reconstruction of closely adjacent tissue slices (for example, given modulation of the radio-frequency excitation) which provide no usable reconstructions with known PPA methods.

A plurality of modulations may be considered as additional modulations of the spin magnetization for monitorable influence of the folding conditions. Included in this, in addition to the additional modulations of the traditional spatial modulations via imaging gradients in the course of the spatial coding, are above all additional modulations of radio-frequency pulses. The additional modulations of the spin excitation can thus, for example, comprise:

the amplitude modulation of radio-frequency pulses, and/or the phase modulation of radio-frequency pulses, and/or the variation of the pulse shape of radio-frequency pulses.

It thereby corresponds in embodiments of the invention that preparation pulses, saturation pulses, inversion pulses, spin excitation pulses, and refocusing pulses are applicable as radio-frequency pulses.

The additional modulations of the gradients used for spatial coding of the subject regions can ensue as, for example:

additional modulation of phase coding gradients, and/or additional modulation of read gradients, and/or additional modulation of gradients for slice selection.

All conceivable additional modulations are naturally applicable individually or also simultaneously.

The additional modulations of the spin magnetization, together with other additional modulations (not cited here, but comparable in effect), are applicable in various stages of the MRT experiment that include all steps necessary for image generation. In particular, additional modulations can be implemented during the spin excitation and/or during the spin refocusing and/or during the spatial coding.

The statements made in the three preceding paragraphs already express that, respectively, combinations made of various additional modulations of the spin magnetization are also applicable.

The additional modulations of the spin magnetization can be repeated before or during each data acquisition, given a measurement that comprises more than one data acquisition per spin excitation. Given a measurement that comprises more than one data acquisition per spin excitation, the same holds true for additional modulations of the spin magnetization that can be repeated only after completion of all data acquisitions belonging to this measurement. The potential of this embodiment concerns above all the possible supplementations to the CAIPIRINHA technique that are shown in FIGS. 10a–c.

The additional modulations of the spin magnetization can be changed between two spin excitations. The same is true for the spin refocusing and the acquisition of the response signals.

In addition to the image data acquired in k-space, what is known as "coil sensitivity" information is required for image reconstruction via Fourier transformation. Given application of additional modulation of the spin magnetization, coil sensitivity information modified according to the respective, preceding, additional modulations of the spin magnetization must imperatively be taken into account for image reconstruction, whereby the modifications of the coil sensitivity information is dependent on the preceding additional modulations of the excited spin magnetization.

Those folding effects that are created along a specific spatial dimension with the additional modulation of the spin magnetization, and that additionally occur in the reduced data sets shifted in at least one other spatial dimension, require modification coil sensitivity information. For example, summarized in the following table are some of the transformations of folding effects from one spatial dimension to another spatial dimension that are possible with the inventive CAIPIRINHA method via additional modulation of the spin magnetization:

| folding effect, original dimension | | folding effect, transformed dimension |
|---|---|---|
| slice direction | → | 2D phase coding direction |
| slice direction | → | read direction |
| 2D/3D phase coding direction | → | read direction |
| 3D phase coding direction | → | 2D phase coding direction |
| 2D phase coding direction | → | 3D phase coding direction |

Various possibilities are considered for the modification of the coil sensitivity information: in the case that the inventive method is not used for auto-calibrated PPA methods, the consideration ensues via subsequent modification of the coil sensitivity information acquired in the corresponding method. Given application of auto-calibrated PPA methods, that above all are of great importance for real-time imaging, the auto-calibration signals are considered for the image reconstruction in place of the modified coil sensitivity information. Naturally, the alternative of the corresponding adaptation of the PPA algorithm to be used in the image reconstruction also always exists in addition to both cited possibilities for modification of the coil sensitivity information according to the respective preceding additional modulations of the spin magnetization.

According to a further embodiment of the invention, given subsequent modification and given new acquisition in already modified form according to the respective preceding additional modulations of the spin magnetization, the coil sensitivity information is registered in a form that allows that the coil sensitivity information can be retrieved for the image reconstruction.

Embodiments of the inventive method also include multi-slice experiments. In multi-slice experiments, the additional modulations of the spin magnetization ensue via phase-modulated spin excitations or spin refocusings, whereby a slice-dependent phase change ensues for each step of the spin excitation, such that a slice-dependent shifting ensues in the phase coding direction. According to a further feature of the invention, the additional modulations of the spin magnetization ensue for multi-slice experiments via an additional gradient in the slice direction during the data acquisition, such that a slice-dependent shifting ensues in the read coding direction. Furthermore, given multi-slice experiments, the slice-dependent shifting in the phase and/or read coding direction is taken into account via a slice-dependent shifting of the coil sensitivity information in the phase and/or read coding direction.

Embodiments of the inventive method also include 3D volume experiments for multi-slice experiments. The additional modulations of the spin magnetization ensue in 3D volume experiments via phase-modulated spin excitations, whereby a slice-dependent phase change ensues for each step of the spin excitation such that a slice-dependent shifting ensues in a phase coding direction. Moreover, the additional modulations of the spin magnetization for 3D volume experiments ensue via an additional gradient in the slice direction during the data acquisition, such that a slice-dependent shifting ensues in the read coding direction. The slice-dependent shifting in the phase and/or read coding direction is taken into account via a slice-dependent shifting of the coil sensitivity information in the phase and/or read coding direction.

Given 3D volume experiments in a first phase coding direction, the phase coding is modulated via an additional phase coding gradient in a second phase coding direction, such that the folding effects that are originally generated along the first phase coding direction additionally occur shifted in the second phase coding direction.

The inventive method can be experimentally converted/translated with a device that allows the use of additional modulations of the spin magnetization, whereby the additional modulations are comprised of modulations of radio-frequency pulses and/or of additional modulation of gradients used for spatial coding of the subject regions; moreover, the inventive device may enable the modification of the coil sensitivity information according to the respective preceding additional modulations of the spin magnetization.

Overall, CAIPIRINHA enables the flexible conditioning of the folding spaces and the corresponding folding effects via additional modulations of the magnetization during the actual data acquisition phase; prevalent PPA methods use conditioning (for example conditioning of the matrix inversion in SENSE) exclusively in postprocessing after the acquisition. This substantial difference will strike experts in the field of PPA imaging as a useful element for improving the image quality.

DESCRIPTION OF THE DRAWINGS

In the following, the features and principles of embodiments of the inventive method (that is also designated abbreviated as CAIPIRINHA (English: Controlled Aliasing In Parallel Imaging Results In Higher Acceleration) are explained using the Figures below, whereby the method processes illustrated here are only a few from a plurality of possibilities.

FIGS. 9A–9D are pictorial illustrations comparing a faster (by a factor R=2) data acquisition for a simultaneous two-slice experiment by way of conventional PPA and a simultaneous two-slice experiment by way of CAIPIRINHA.

DETAILED DESCRIPTION OF THE PREFERRED EMBODIMENTS

Two possible operations according to embodiments of the inventive method are summarized in the paragraphs below.

A) Modulation of the folding spaces by way of RF

In this case of a CAIPIRINHA acquisition, modulations of the folding spaces are generated via corresponding RF excitations, as is shown in the following using a two-dimensional two-slice experiment. In this example (see FIGS. 3 and 4), two directly adjacent slices 30, 32 in a subject are excited by way of a two-slice RF pulse 34. The spatial proximity requires approximately identical coil sensitivities over both slices; as a result (for R=2, meaning the information of two slices was acquired in the measurement time of one slice), a simple sum image of both slices is obtained. From the standpoint of PPA reconstruction (see, for example, SENSE), both slices can also not be separated in the PPA postprocessing since the in-folding matrix cannot be inverted due to identical sensitivities.

Figure 5A:
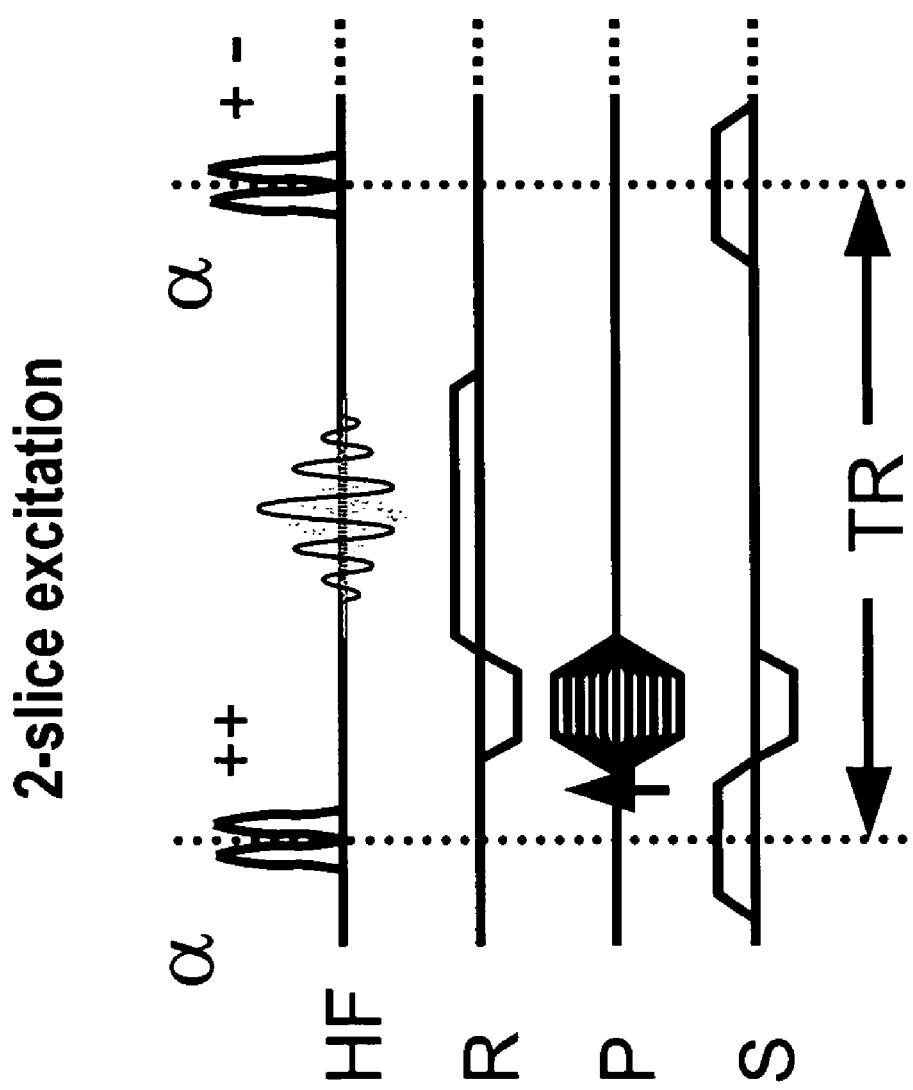
FIG. 5A is a graph showing an excitation possible with the inventive CAIPIRINHA method in a simultaneous two-slice CAIPIRINHA experiment.
Figure 5B:
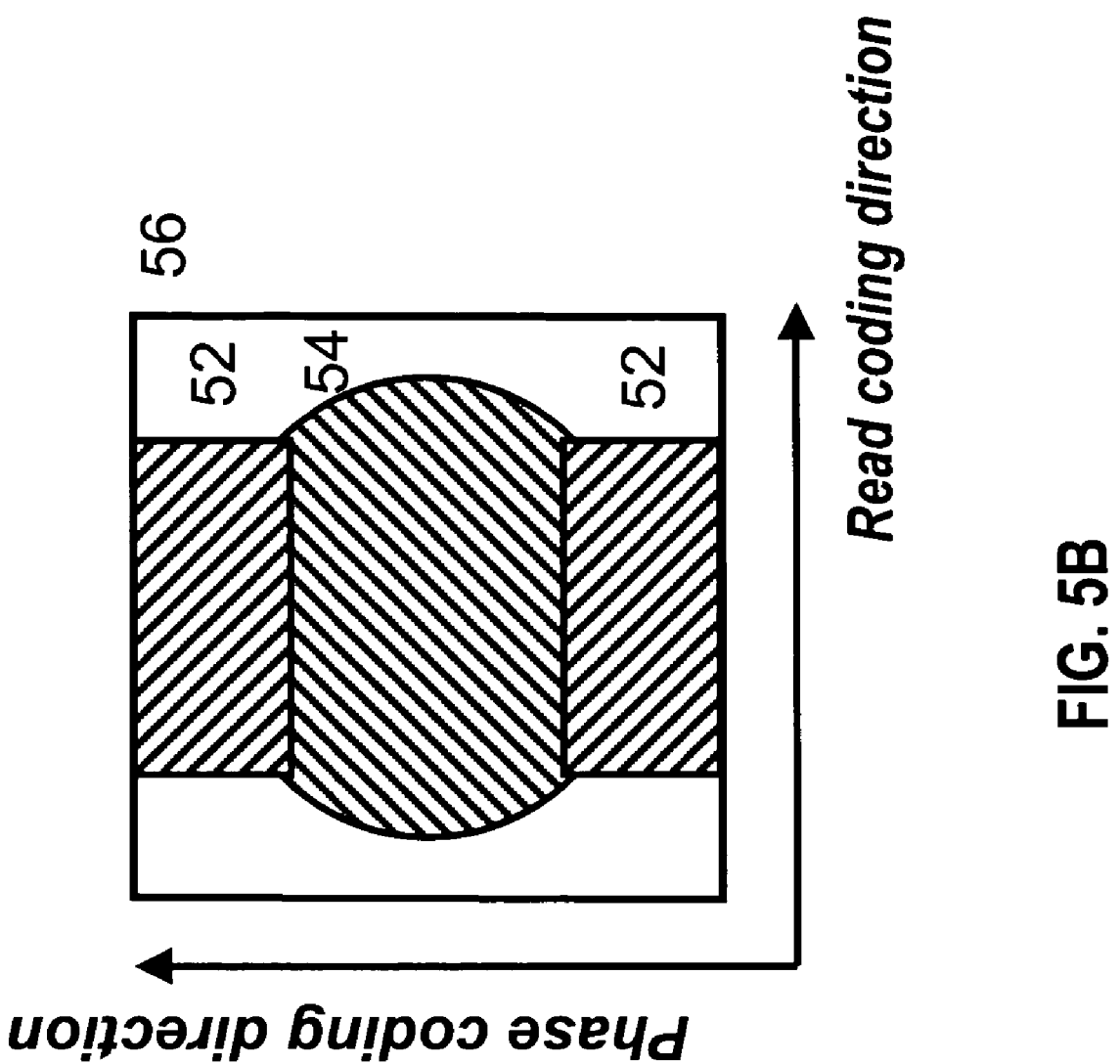
FIG. 5B is a graphs showing the effect of the modulation on the superimposition of the slices.

However, if a phase-modulated RF excitation is used, i.e., if the pulse phases are modulated from one two-slice excitation to the next as (0°, 0°=++) and (0°, 180°=+−), a shifting of both slice data sets effectively ensues in the phase coding direction, or, in other words: the folding effects have been modulated, starting from the pure slice direction superimposition, such that they have been transformed/modified in the phase coding direction and appear there shifted/displaced against on another; i.e., via the phase-modulated excitation, image parts are now superimposed that have different coil sensitivities (see FIG. 5B). This example shows that the modulation of the folding space implemented with CAIPIRINHA during the acquisition makes possible unfoldings that would be impossible with the original postprocessing PPA methods: unfolding of subjects that register the identical coil sensitivities. As already noted above, the undertaken shifting of the slice information in the phase coding direction during the data acquisition must be allowed for via a new arrangement of the coil sensitivity information in which reconstruction is allowed for. Since the subject regions undergoing folding have very different coil sensitivities. An effective unfolding of the two-slice information is enabled.

The specified two-slice can naturally also be implemented with more than just two slices (in the general case, N slices) and in three-dimensional (3D) imaging. It must fundamentally be noted that the shifting of the folding spaces implemented via special form of the RF excitation could also be implemented via corresponding transmitter arrays. It is important only that the original folding spaces mutually shift via RF-induced spatially-dependent modulation. Naturally, coil sensitivity information modified according to the additional modulations of the spin magnetization must be taken into account for reconstruction.

Figure 8E:
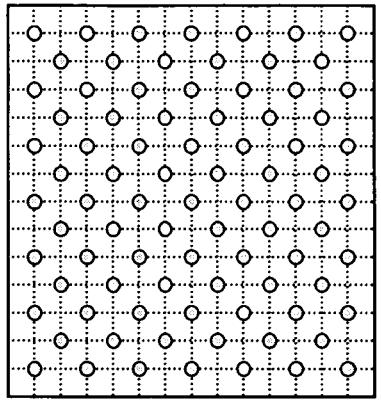
FIGS. 8A–8F are pictorial illustrations showing various shifting of folding effects possible via the inventive method using the change of the data acquisition schemata at a CAIPIRINHA in vivo example.
Figure 8F:
Figure 8C:
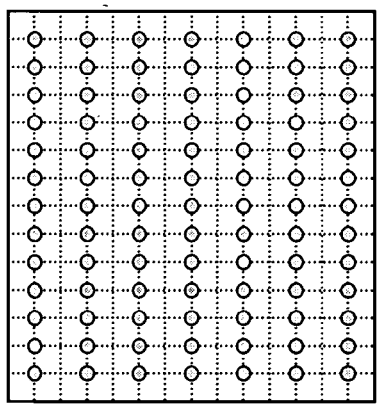
Figure 8D:
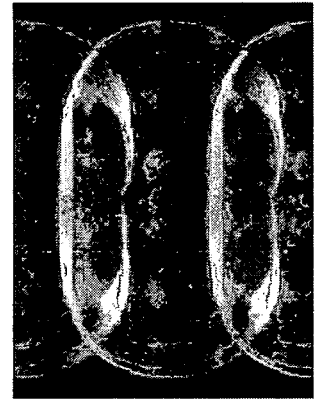
Figure 8A:
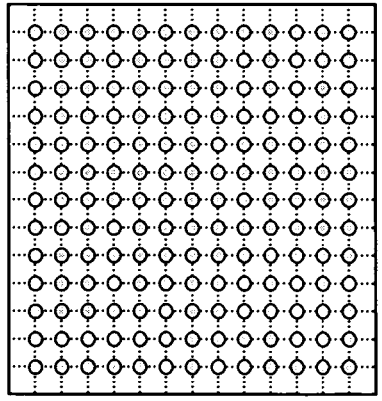
Figure 8B:
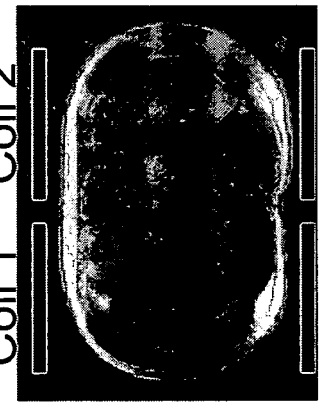

B) Modulation of the folding spaces by way of altered magnetic field gradient control In this case of the CAIPIRINHA technology that can be used, for example, for 3D imaging, modulations (i.e., shifts) of the folding spaces are effected via corresponding changes in the phase coding schema of the acquisition. FIG. 8A shows a complete data set (meaning R=1) in k-space and the associated (unfolded) image 8B in which coils are also recorded. FIG. 8C (center top) shows a reduced k-space data set (with R=2) and the associated image with in-foldings (see center bottom, 8D). The folding ensues here "uncontrolled" only in one coding direction (coding direction 1 in the image). With the data acquisition schemata following the CAIPIRINHA principles (see right top), the folding that originally ensues exclusively in the coding direction 1 is changed such that the folding effect now also ensues additionally shifted in the coding direction 2 (see right bottom). This achieves having the folding effects now distribute more effectively in two spatial dimensions, and thereby can be better unfolded.

For the hypothetical extreme case that coil 1 and coil 2 possess identical coil sensitivities and coil 3 and 4 possess different but also identical coil sensitivities, no unfolding can be achieved in the coding direction 1 by way of a conventional PPA method, since, from the standpoint of the PPA reconstruction (see, for example, SENSE), the unfolding matrix does not exist due to identical sensitivities. However, if we use a modulated spatial coding schemata, as is shown in FIG. 8 (top right), an additional shifting of the folding effects effectively ensues in a further spatial dimension (coding direction 2), meaning that, starting from the pure superimposition in the coding direction 1, the folding effects have been modulated such that they have additionally been modified/transformed in the coding direction 2. In this case, image parts that have different coil sensitivities are thus now in turn superimposed via the change of the spatial coding schemata. This example shows that the modulation of the folding space implemented with CAIPIRINHA during the acquisition makes possible unfoldings that would be impossible with the original postprocessing PPA methods: unfolding of subjects that register identical coil sensitivities. The undertaken alteration of the folding effects during the data acquisition must also again here be accommodated via modified coil sensitivity information.

Figure 1:
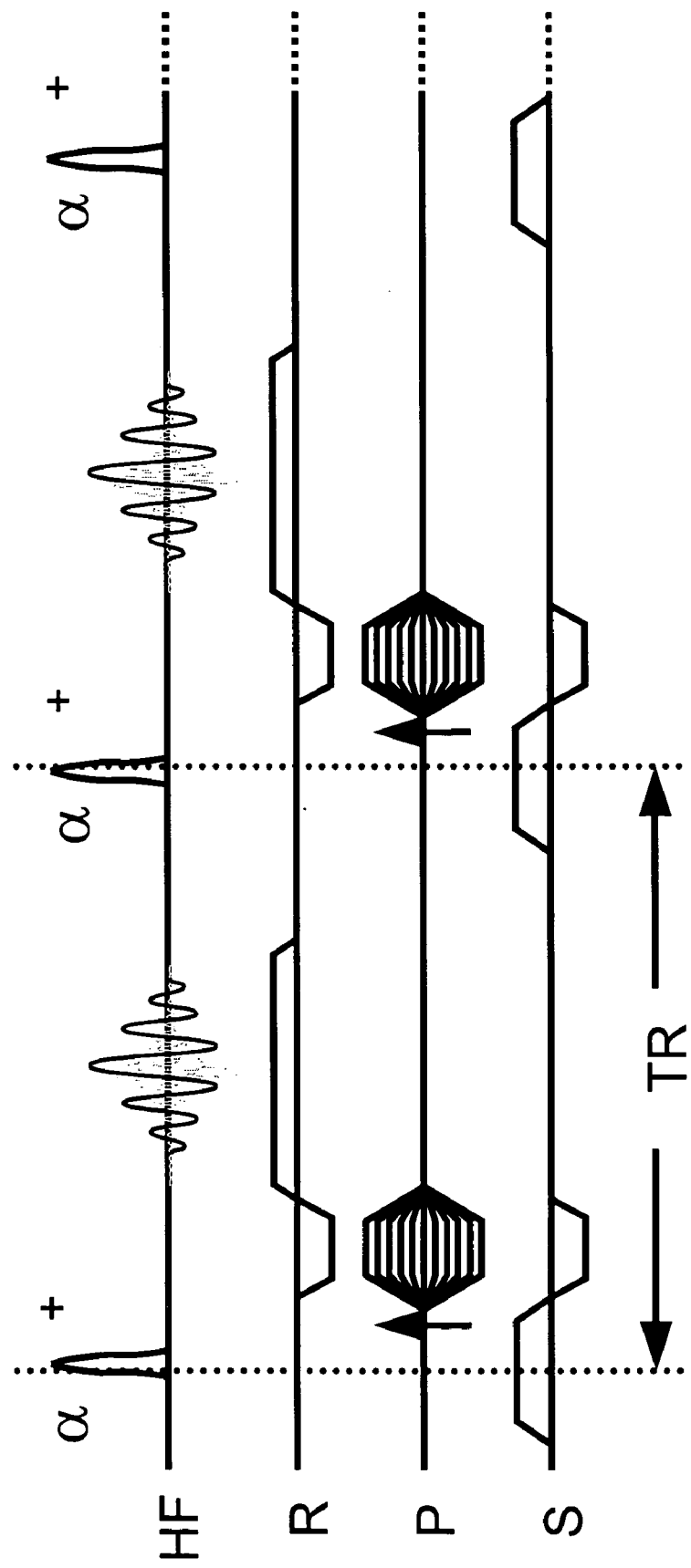
FIG. 1 is a graph showing the schema of a pulse sequence as it is applicable for single-slice experiments according to the prior art.

Referring now to the Figures for more extensive discussion, in FIG. 1, the schema of a pulse sequence is shown as it is applicable for single-slice experiments according to the prior art. The radio-frequency pulse a is shown in the uppermost line with the pulse phase +. The gradients $G_z$ (necessary for spatial coding) for slice selection (S) and $G_x$ and $G_y$ for frequency coding (R) or for phase coding (P) are shown in the lower lines and are respectively characterized by the appertaining reference letters. The time interval between two spin excitations is illustrated by a repetition time TR.

Figure 2:
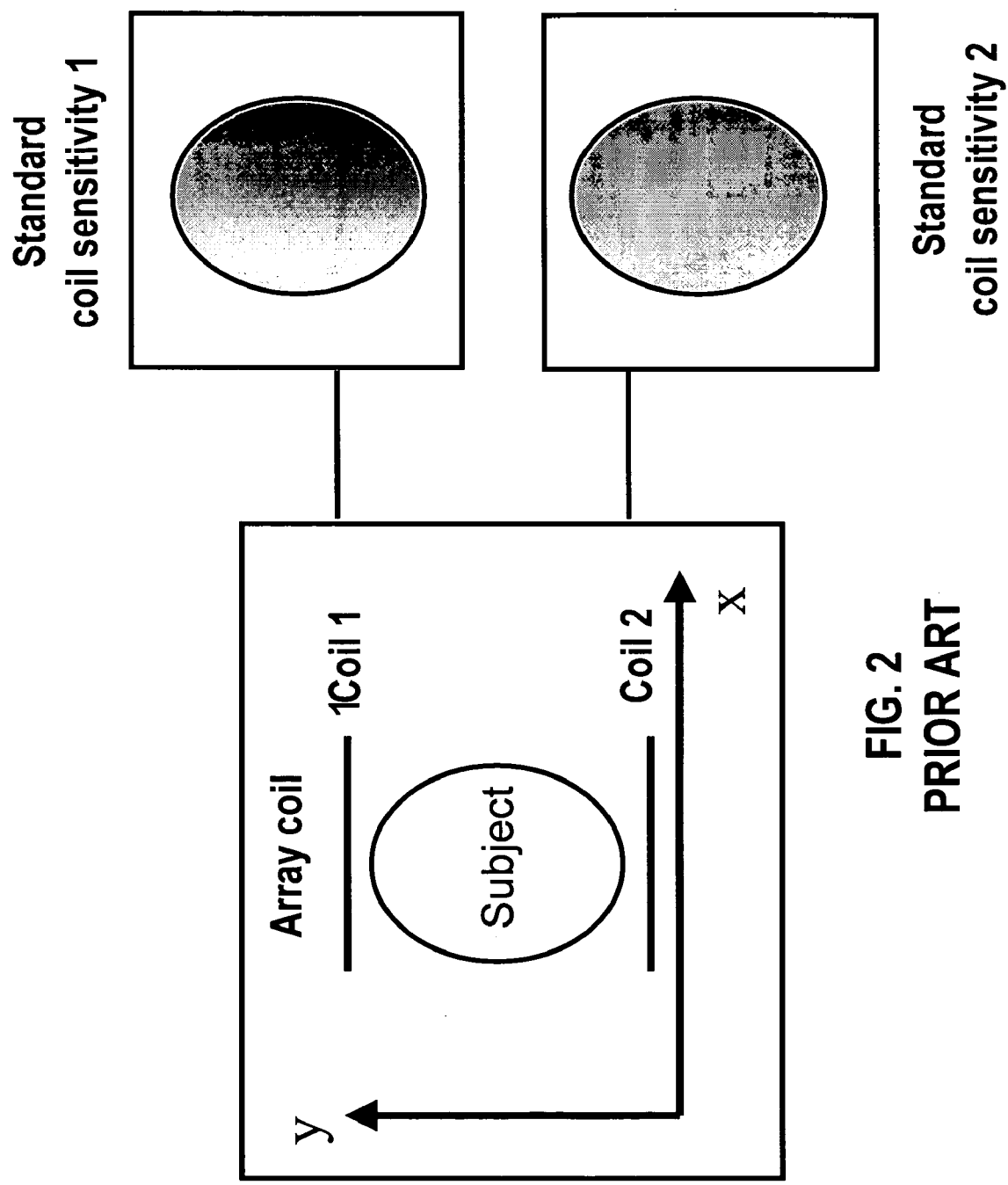
FIG. 2 is a pictorial block diagram showing the schematic representation of a coil array comprising two radio-frequency receiver coils.

FIG. 2 shows the schematic representation of a coil array comprising two radio-frequency receiver coils, coil 1 and coil 2. Such an arrangement is typically used for the PPA acquisition. It is important that both coils in the shown example exhibit a different coil sensitivity, coil sensitivity 1 and coil sensitivity 2.

Figure 3A:
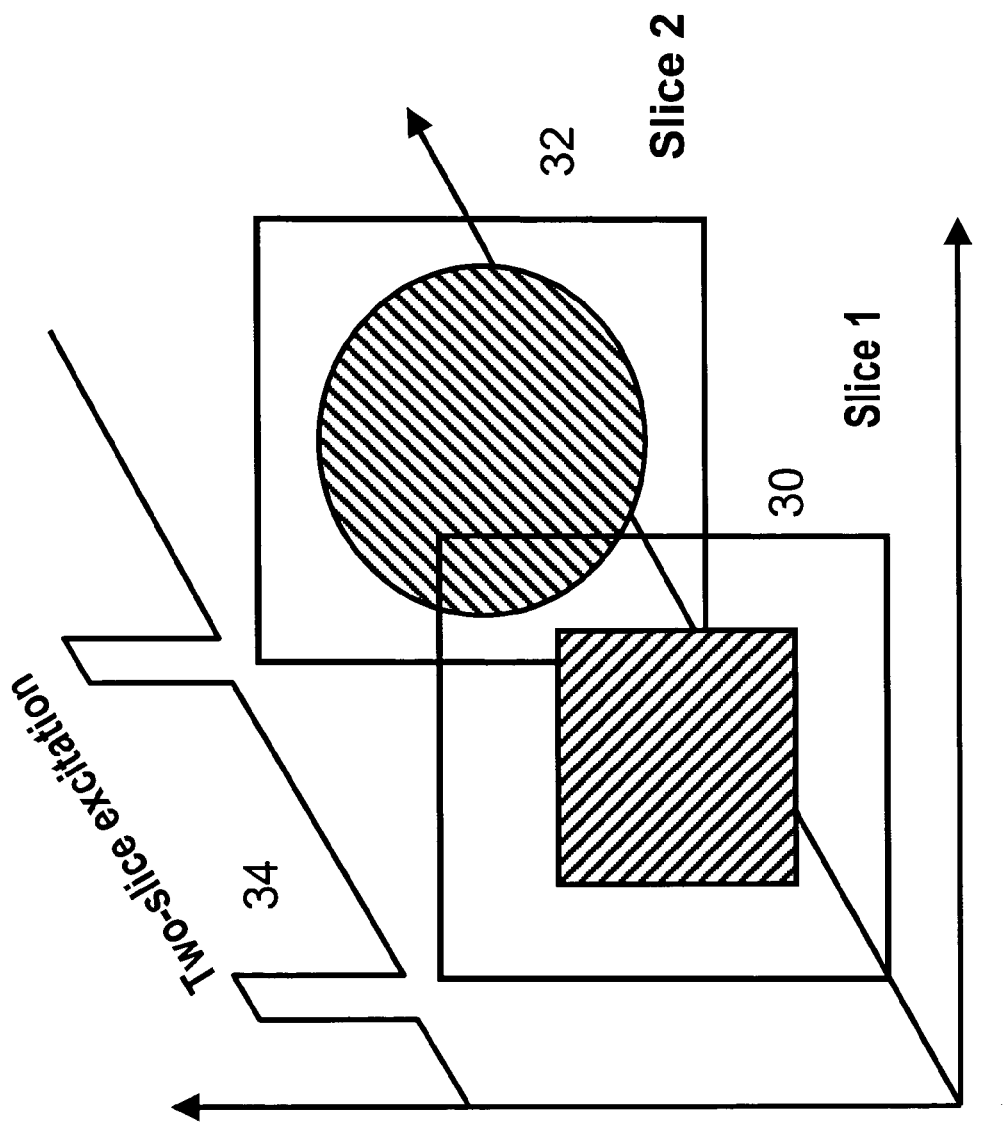
FIG. 3A is a graph showing the schema of a simultaneous two-slice experiment according to the prior art.

The schema of a simultaneous two-slice experiment according to the prior art is shown in FIG. 3A (Larkman D J, Hajnal J V, Herlihy A H, Coutts G A, Young I R, Ehnholm G. Use of multicoil arrays for separation of signal from multiple slices simultaneously excited. J Magn Reson Imaging. 2001 February;13(2):313–7.) In this example, two directly adjacent slices 30, 32 in a subject are excited by way of a two-slice RF pulse 34 according to the pulse sequence shown in FIG. 3B. The spatial proximity causes nearly identical coil sensitivities over both slices; as a result, a simple sum image of both slices 36 is obtained (FIG. 3C), meaning the folding ensues in this case in the spatial direction of the slice direction. From the standpoint of the PPA reconstruction (see, for example, SENSE), both slices can therefore also not be separated in the PPA postprocessing, since the unfolding matrix can only be poorly inverted due to identical sensitivities.

Figure 3B:
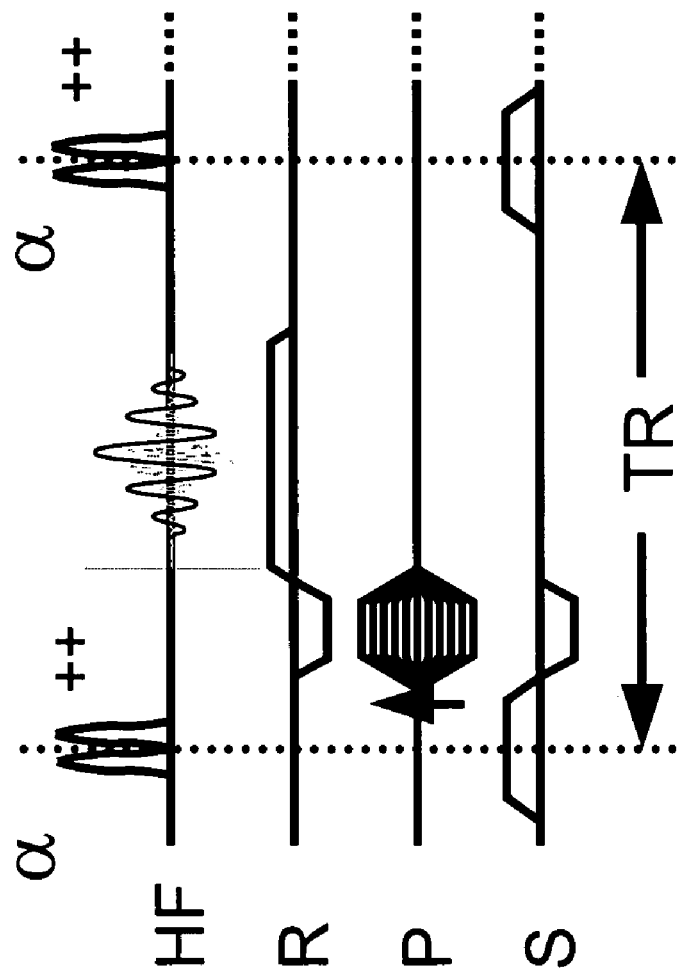
FIG. 3B is a graph showing a pulse sequence used to excite the two directly adjacent slices in a subject.
Figure 3C:
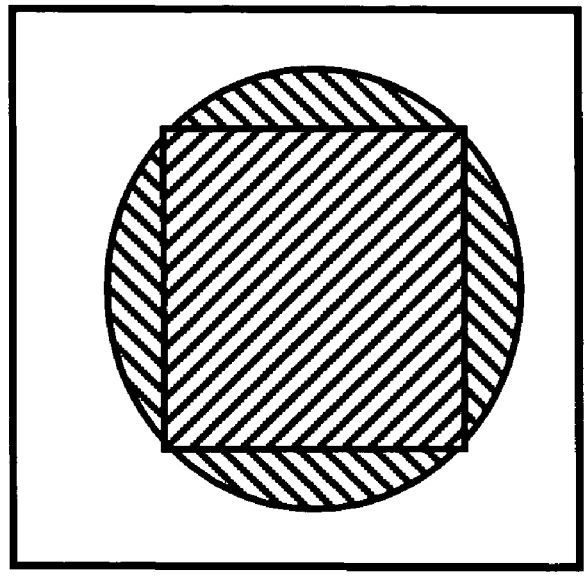
FIG. 3C is a graph showing the resultant sum image of both slices obtained.
Figure 4:
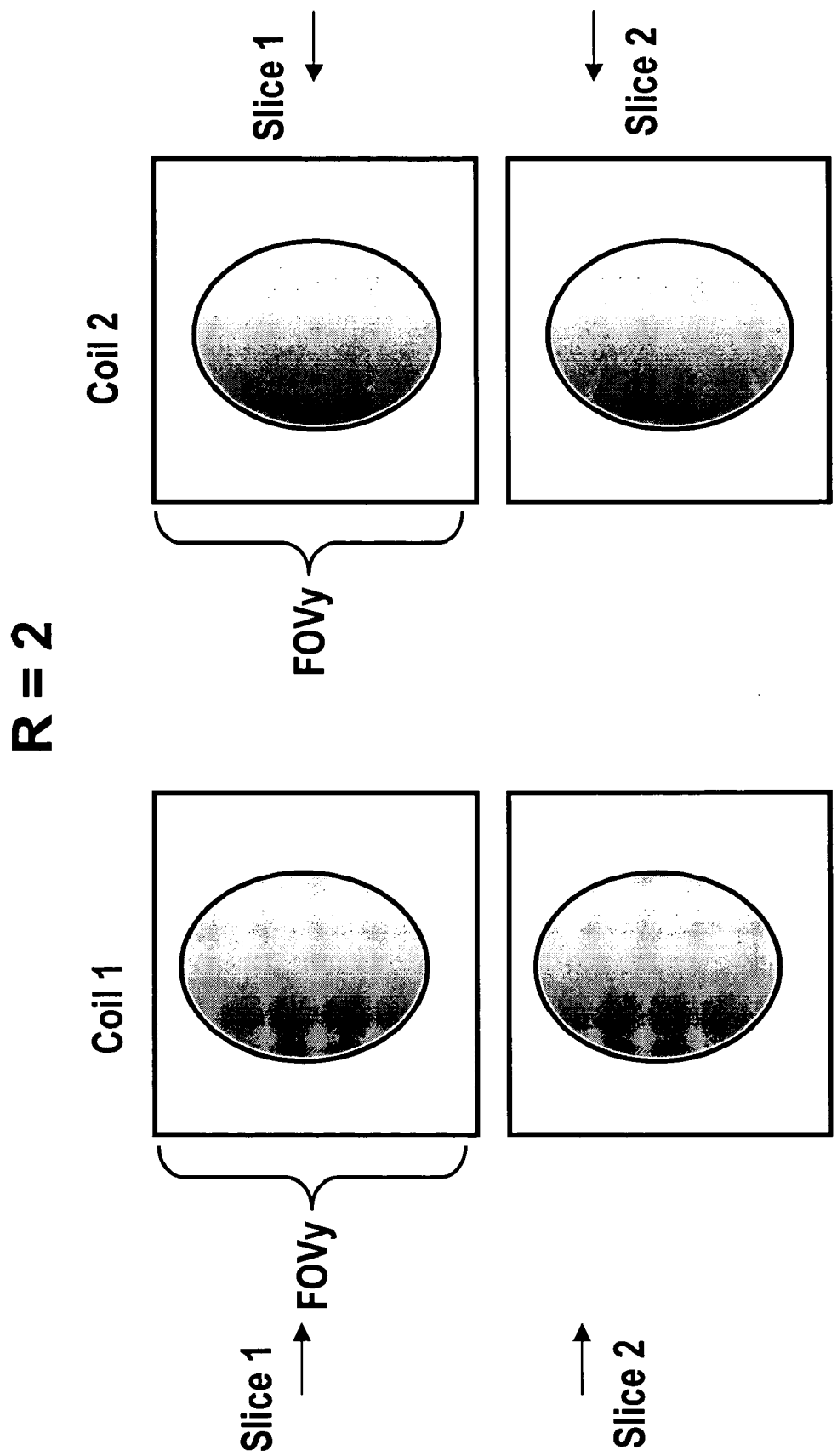
FIG. 4 is a chart showing the conventional arrangement of the coil sensitivities for the 2-coil arrangement of the two-slice experiment described in FIGS. 3A through 3C.

FIG. 4 shows the conventional arrangement of the coil sensitivities for the 2-coil arrangement of the two-slice experiment described in FIGS. 3A through 3C. The information is thereby separated for each slice, slice 1 and slice 2 acquired by both coils, coil 1 and coil 2. The shortening of the image measurement time achieved in the PPA method via use of two or more coils corresponds to the ratio of the number of the lines of the complete data set to the number of the lines of the reduced data set and is denoted as what is known as the reduction factor R. (Given R=2, the information of 2 slices is acquired in the measurement time of one slice). The selected imaging region is designated as a Field-Of-View (FOV).

Shown in FIG. 5A is an excitation possible with the inventive CAIPIRINHA method in a simultaneous two-slice CAIPIRINHA experiment. Here a phase-modulated RF excitation is used as an additional modulation of the spin magnetization. In this modulation, the pulse phases are modulated from one two-slice excitation to the next as (0°, 0°=++) and (0°, 180°=+−). A slice-dependent modulation thereby effectively ensues in the phase coding direction.

FIG. 5B illustratively shows the effect of the modulation on the superimposition of the slices 56. The slice represented by the square 52 has been shifted in the phase coding direction relative to the second slice 54 (whose position remains unchanged), or, in other words: starting from the pure slice direction superimposition, the folding effects are modified such that they appear shifted in the phase coding direction; i.e., via the phase-modulated excitation, image parts are now superimposed that "see" different coil sensitivities. This example shows that the modulation of the folding space implemented with CAIPIRINHA during the acquisition makes possible unfoldings that would be impossible with only the original postprocessing PPA methods, namely the unfolding of subjects that register the identical coil sensitivities. As already noted above, the undertaken shifting of the slice information in the phase coding direction during the data acquisition must be allowed for via a modification of the coil sensitivity information.

Figure 6:
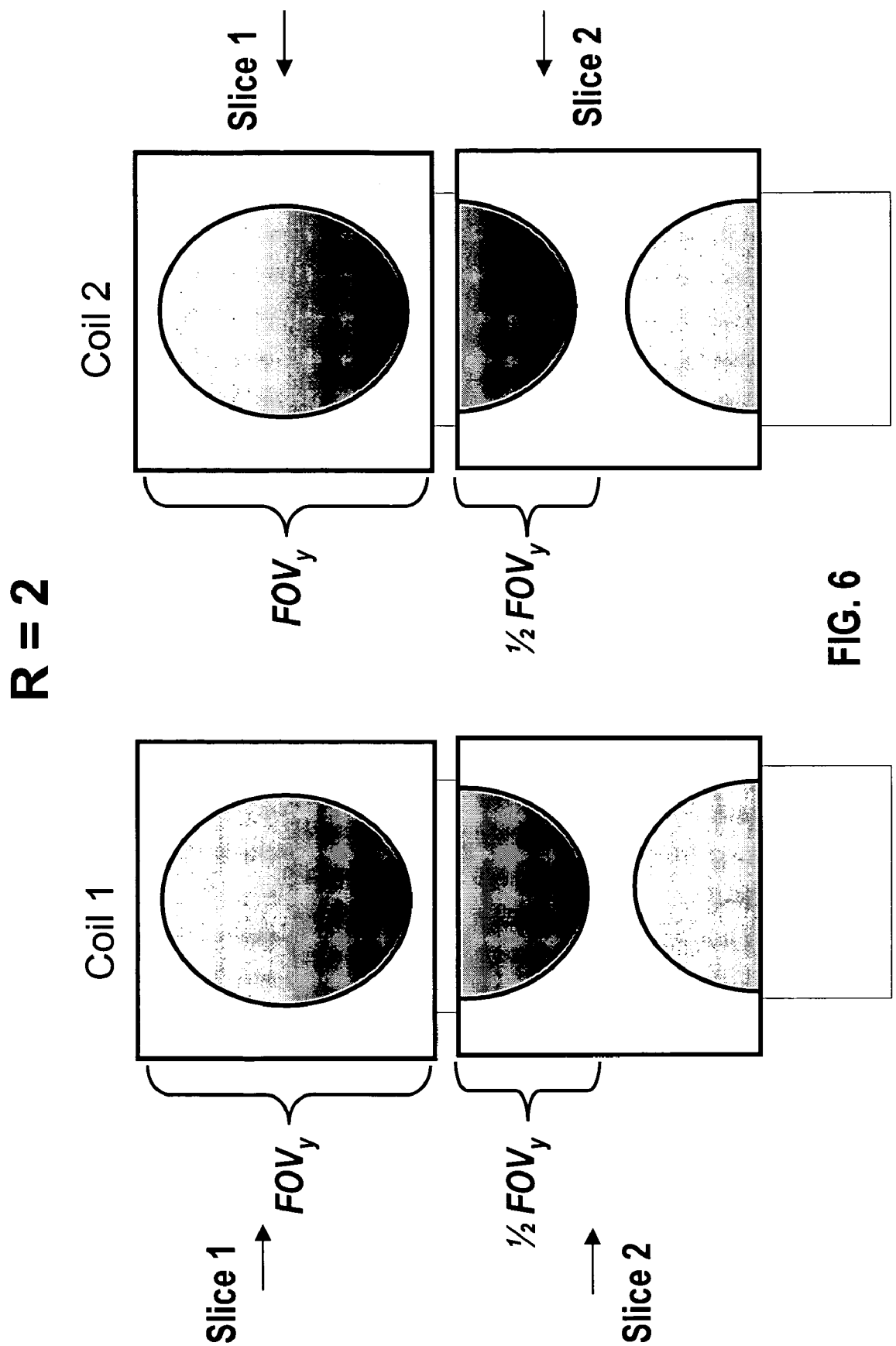
FIG. 6 is a chart showing the rearrangement of the original coil sensitivities used in the inventive method for image reconstruction of a simultaneous two-slice experiment.

In FIG. 6, the rearrangement of the original coil sensitivities is shown that is necessary given application of the inventive method for image reconstruction of a simultaneous two-slice experiment. The rearrangement of the coil sensitivities is, as already noted, necessary because the shifting of the individual slices implemented during the image reconstruction can otherwise not be taken into account in the image reconstruction.

In a conventional experiment, 2 slices would come to lie directly atop one another; slice 1 folds directly onto slice 2. With the inventive method, slice 1 is now shifted relative to slice 2 in the first step (meaning during the data acquisition) such that these no longer come to lie directly atop one another. This deliberately implemented shifting must be taken into account in the framework of the image reconstruction via a corresponding shifting (i.e. new arrangement) of the coil sensitivities. Only then can an effective separation of both items of slice information (=unfolding) be undertaken in the postprocessing. The clarifications made here for a simultaneous two-slice experiment of the inventive method can naturally be analogously transferred to other experiments with more than two slices and higher reduction factors.

Figure 7A:
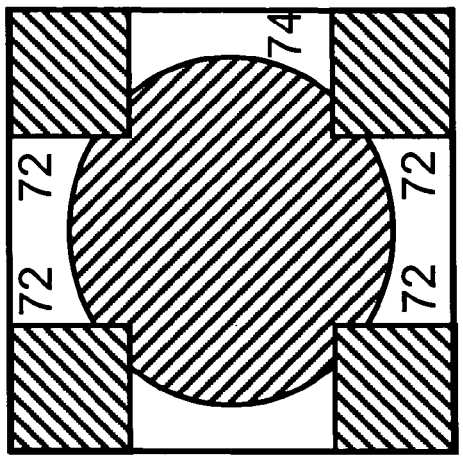
FIGS. 7A–7D are graphs schematically showing further possibilities of the slice shifting.
Figure 7B:
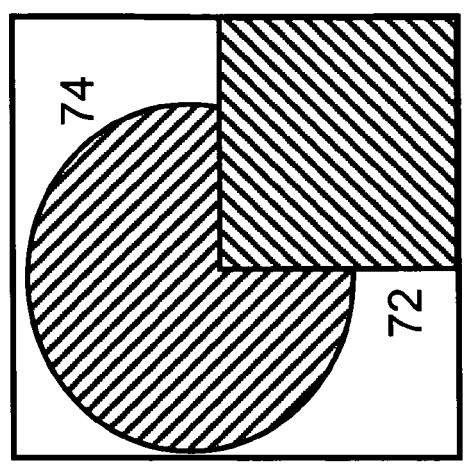
Figure 7C:
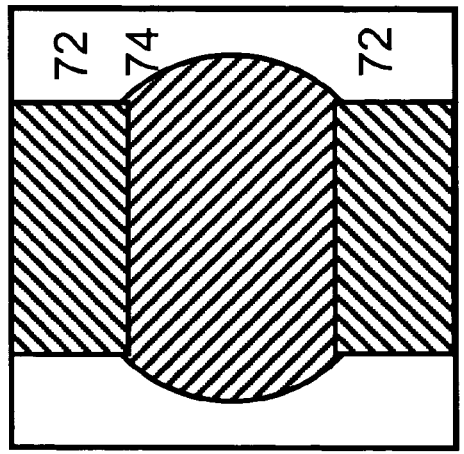
Figure 7D:
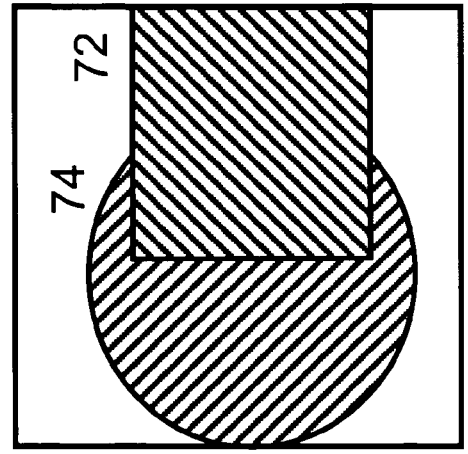

FIGS. 7A–7D schematically show further possibilities of the slice shifting, whereby the slice 72 represented in FIG. 7B by the square has been shifted in the direction of both spatial dimensions. (In FIG. 7A, the shifting ensues only in the direction of the "spatial dimension 2"). In FIG. 7C, both slices 72, 74 are shifted in the same spatial dimension. Finally, the shifting of both slices 72, 74 in the direction of both spatial dimensions is shown in FIG. 7D.

The shifting of folding effects possible via the inventive method is shown in FIG. 8 using the change of the data acquisition schemata at a CAIPIRINHA in vivo example. The image acquired in the abdominal space of a test subject is shown below the respective coding schema. FIG. 8A shows the complete acquisition schema in two coding directions. FIG. 8B shows the reconstruction of this data set and comprises the complete image information. FIG. 8C shows the coding schema for a data set (R=2) reduced in a coding direction. FIG. 8D shows the reconstruction of the data set 8C with the associated in-foldings, which are only generated in the direction of the reduced coding direction. FIG. 8E shows the acquisition schema of a data set (R=2) reduced according to the invention, whereby in this example the modulation exists in that each second data point is modulated by an additional gradient. FIG. 8F shows the associated image reconstruction with the altered in-folding effects, which now appear shifted in both dimensions.

This acquisition schema can be easily transferred to a 3D volume experiment. In this case, the shown coding directions corresponding to the two phase coding directions necessary for the 3D volume experiment.

FIGS. 9A–9D show that the faster (by a factor R=2) data acquisition for a simultaneous two-slice experiment by way of conventional PPA (FIGS. 9A and B) provides no significant image in comparison to the simultaneous two-slice experiment by means of CAIPIRINHA (likewise with R=2). The attempt at a SENSE reconstruction shows that the slices spatially separated by only 0.5 cm can not be reconstructed by means of this standard PPA method (FIG. 9B). The corresponding example of a CAIPIRINHA reconstruction shows the potential of the method for separating two directly adjacent slices with advantage for the medical diagnostic.

Figure 10A:
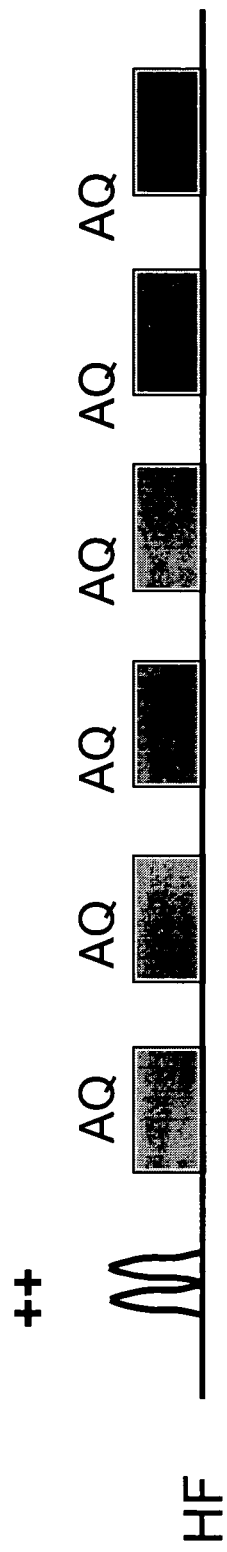
FIGS. 10A–10C are graphs illustrating possible supplements to the CAIPIRINHA technique.
Figure 10A:
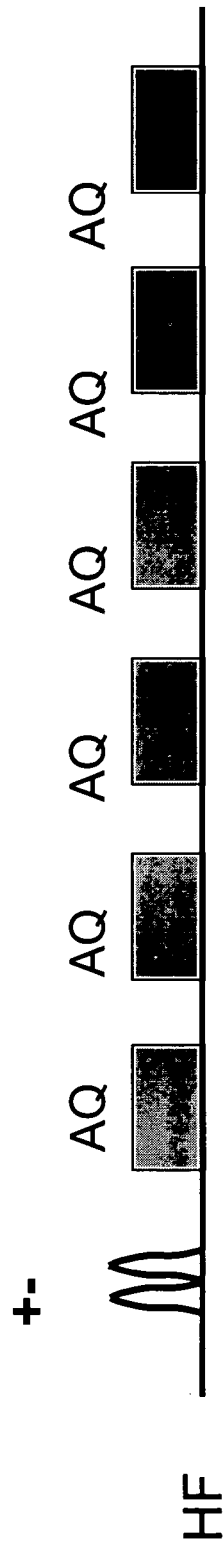
Figure 10B:
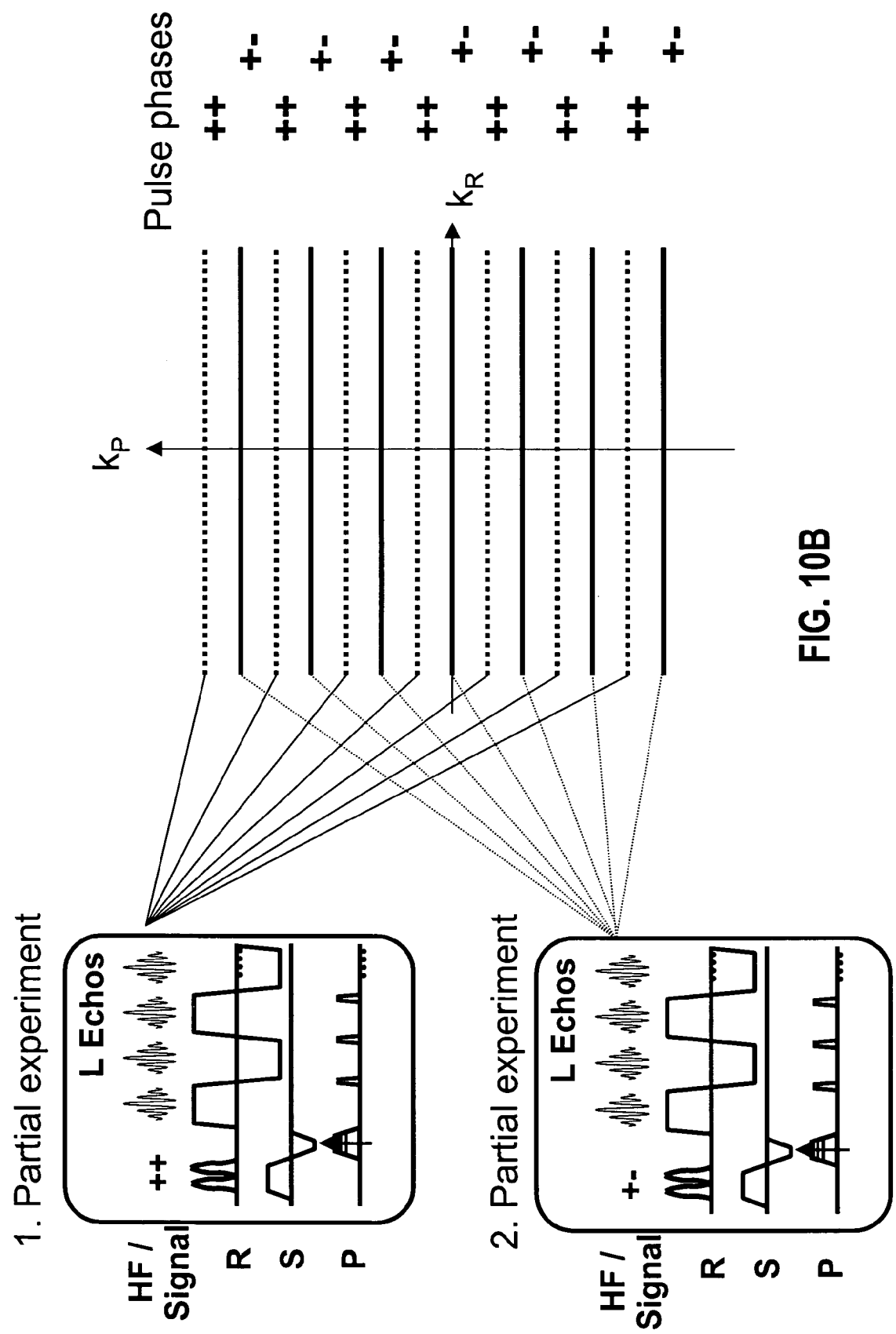
Figure 10C:
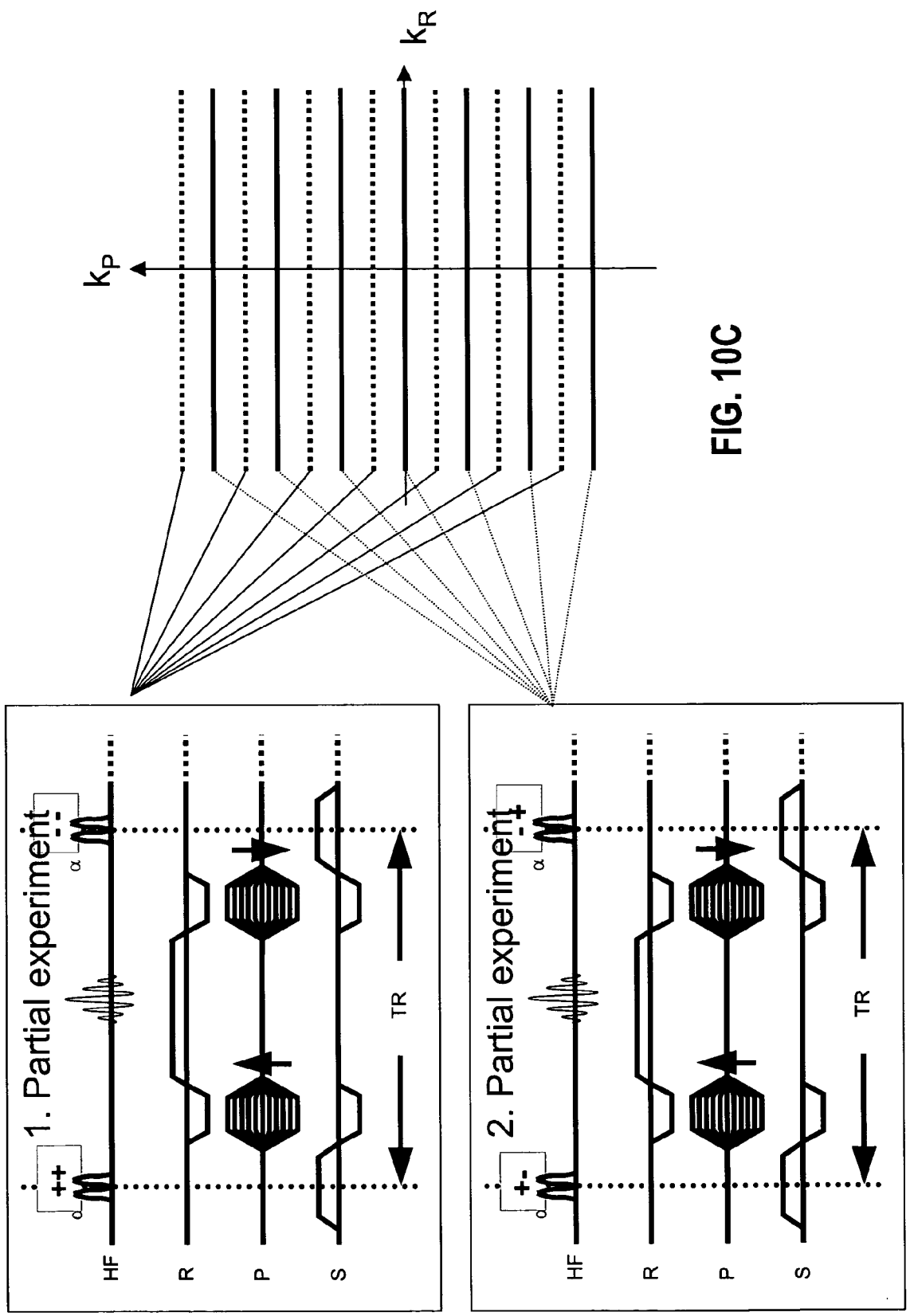

Possible supplements to the CAIPIRINHA technique are shown in FIGS. 10A–10C:

FIG. 10A shows the transfer of the CAIPIRINHA multi-slice principles to a segmented data acquisition schemata (for example, to be used in techniques such as RARE, EPI, True FISP, etc.) with corresponding RF pulse-phase modulation. In this case, the modulation ensues in the spin excitation, whereby no new modulation of the spin magnetization ensues during the subsequent echo train. Additional modulations can, however, also ensue before or during the acquisition of the individual echoes.

FIG. 10B shows a possible CAIPIRINHA implementation for a segmented simultaneous two-slice EPI experiment. The complete first echo train with L echoes is provided with the pulse phase (++) with the same modulation. After the data acquisition, both echo trains are arranged according to their phase coding. Thus a shifting of both slices against one another is achieved as already specified.

FIG. 10C shows a possible transfer to a segmented two-slice TrueFISP experiment. The first half of the acquisitions is alternately provided with a pulse phase cycle (++,−−) while the other half is provided with a modulated pulse phase cycle (+−,−+). After the data acquisition, the acquired data are arranged according to their phase coding. Thus a shifting of both slices against one another is achieved as already specified.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The present invention may be described in terms of functional block components and various processing steps. Such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more microprocessors or other control devices. Similarly, where the elements of the present invention are implemented using software programming or software elements the invention may be implemented with any programming or scripting language such as C, C++, Java, assembler, or the like, with the various algorithms being implemented with any combination of data structures, objects, processes, routines or other programming elements. Furthermore, the present invention could employ any number of conventional techniques for electronics configuration, signal processing and/or control, data processing and the like.

The particular implementations shown and described herein are illustrative examples of the invention and are not intended to otherwise limit the scope of the invention in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

What is claimed is:

1. A method for magnetic resonance imaging of a contiguous region of a subject, comprising:

applying a partially parallel acquisition (PPA) via modulation of spin magnetization using radio-frequency pulses as well as using spatial coding of the subject region and using subsequent measurement in cycles of radio-frequency response signals showing excited spins;

measuring the radio-frequency response signals by a coil array comprising two or more radio-frequency receiver coils via which both coil sensitivity information and the radio-frequency response signals are acquired;

acquiring, by each radio-frequency receiver coil, a reduced data set for implementation of image reconstruction;

utilizing additional modulations of spin magnetization, the additional modulations being comprised of modulations of at least one of radio-frequency pulses or additional modulation of gradients used for spatial coding of the subject regions; and modifying the coil sensitivity information according to the respective preceding additional modulations of the spin magnetization.

2. The method according to claim 1, wherein the additional modulations comprise at least one of amplitude modulation of radio-frequency pulses, phase modulation of radio-frequency pulses, and variation of the pulse shape of radio-frequency pulses, wherein the radio-frequency pulses are selected from the group consisting of preparation pulses, saturation pulses, inversion pulses, spin excitation pulses, and refocusing pulses.

3. The method according to claim 1, wherein the additional modulations of the gradients used for spatial coding of the subject regions ensue via at least one of additional modulation of phase coding gradients, additional modulation of read gradients, and additional modulation of gradients for slice selection.

4. The method according to claim 1, wherein the additional modulations can be implemented during at least one time period selected from the group consisting of spin preparation, spin refocusing, and spatial coding.

5. The method according to claim 1, further comprising combinations of the various additional modulations of the spin magnetization.

6. The method according to claim 1, further comprising repeating, before or during each data acquisition, additional modulations of the spin magnetization, given a measurement that comprises more than one data acquisition per spin excitation.

7. The method according to claim 1, further comprising repeating, after completion of all data acquisitions belonging to a particular measurement, the additional modulations of the spin magnetization, given a measurement that comprises more than one data acquisition per spin excitation.

8. The method according to claim 1, further comprising changing the additional modulations of the spin magnetization according to at least one of the following: a) from one spin excitation to a next one, b) from one spin refocusing to a next one, and c) from one acquisition of response signals to the next one.

9. The method according to claim 1, wherein the modification of the coil sensitivity information is dependent on the additional modulations of the excited spin magnetization.

10. The method according to claim 1, wherein the modification of the coil sensitivity information concerns those folding effects that are generated without the additional modulations of the spin magnetization along a specific spatial dimension and that, after the additional modulations of the spin magnetization, occur shifted in at least one of the other spatial dimensions in the reduced data sets.

11. The method according to claim 1, wherein the modification of the coil sensitivity information comprises at least one of:

a) subsequently modifying the coil sensitivity information according to a respective, preceding, additional modulations of the spin magnetization;

b) retaining its new acquisition in already modified form according to a respective, preceding, additional modulations of the spin magnetization; and c) adapting the PPA algorithm according to the respective, preceding, additional modulations of the spin magnetization.

12. The method according to claim 1, wherein the modifications of the coil sensitivity information according to the respective, preceding, additional modulation of the spin magnetization ensue given auto-calibrated methods in the acquisition of the coil sensitivity information.

13. The method according to claim 1, further comprising retrieving, for image reconstruction, the coil sensitivity information modified according to respective, preceding, additional modulation of the spin magnetization.

14. The method according to claim 1, wherein, for multi-slice experiments, the additional modulations of the spin magnetization ensue via phase-modulated spin excitations or spin refocusings, the spin excitation ensuing via a slice-dependent phase change.

15. The method according to claim 1, wherein, for multi-slice experiments, the additional modulations of the spin magnetization ensue via an additional gradient or a change of the gradient in a slice direction during the acquisition.

16. The method according to claim 1, further comprising:
utilizing, for multi-slice experiments, at least one of slice-dependent shifting in the phase and read coding direction via a slice-dependent shifting of the coil sensitivity information in at least one of the phase and read coding direction.

17. The method according to claim 1, wherein, for 3D volume experiments, additional modulations of the spin magnetization ensue via phase-modulated spin excitations, the spin excitation ensuing via a slice-dependent phase change.

18. The method according to claim 1, wherein, for 3D volume experiments, additional modulations of the spin magnetization ensue via an additional gradient in a slice direction during the data acquisition.

19. The method according to claim 1, further comprising:
utilizing, for 3D volume experiments, slice-dependent shifting in at least one of a phase and read coding direction via a slice-dependent shifting of the coil sensitivity information in at least one of the phase and read coding direction.

20. The method according to claim 1, further comprising:
modulating, for 3D volume experiments, a phase coding in a first phase coding direction by an additional phase coding gradient in a second phase coding direction.

21. A magnetic resonance imaging device, comprising:
a magnet to generate a homogenous magnetic field;
an excitation device to excite nuclear magnetic resonance in a contiguous region of a subject;
an acquisition device to acquire response signals of the excited spins;
the excitation device and the acquisition device configured to operate in repeated cycles;
RF receiver coils configured to acquire the response signals that belong to a coil array comprising two or more radio-frequency receiver coils;
a reduced data acquisition device to acquire a reduced data set of measured RF signals of each individual coil; and
an additional device configured to utilize additional modulations of spin magnetization, wherein the additional modulations are comprised of modulations of at least one of radio-frequency pulses or additional modulation of gradients used for spatial coding of the subject regions, and to utilize a modification of the coil sensitivity information according to a respective preceding additional modulations of the spin magnetization.

* * * * *